(12) United States Patent
Yang

(10) Patent No.: US 10,229,968 B2
(45) Date of Patent: *Mar. 12, 2019

(54) ADVANCED METAL INSULATOR METAL CAPACITOR

(71) Applicant: International Business Machines Corporation, Armonk, NY (US)

(72) Inventor: Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/906,883

(22) Filed: Feb. 27, 2018

(65) Prior Publication Data

US 2018/0190758 A1 Jul. 5, 2018

Related U.S. Application Data

(63) Continuation of application No. 15/399,696, filed on Jan. 5, 2017, now Pat. No. 10,008,558.

(51) Int. Cl.
*H01L 49/02* (2006.01)
*H01L 21/3205* (2006.01)
*H01L 21/3105* (2006.01)

(52) U.S. Cl.
CPC ........ *H01L 28/40* (2013.01); *H01L 21/31051* (2013.01); *H01L 21/32051* (2013.01)

(58) Field of Classification Search
CPC ... H01L 21/32051; H01L 28/40; H01L 28/75; H01L 27/10805
See application file for complete search history.

(56) References Cited

U.S. PATENT DOCUMENTS

| | | | |
|---|---|---|---|
| 5,675,184 A | 10/1997 | Matsubayashi |
| 5,741,626 A | 4/1998 | Jain |
| 5,879,985 A | 3/1999 | Gambino |
| 6,287,910 B2 | 9/2001 | Lee |
| 6,461,914 B1 | 10/2002 | Kai |
| 6,670,237 B1 | 12/2003 | Loh |
| 6,764,915 B2 | 7/2004 | Lee |
| 6,836,400 B2 | 12/2004 | Abdul-Ridha |
| 7,223,654 B2 | 5/2007 | Yang |
| 7,671,394 B2 | 3/2010 | Booth |

(Continued)

OTHER PUBLICATIONS

List of IBM Patents or Patent Applications Treated as Related.
IBM Patents or Patent Applications Treated as Related.

*Primary Examiner* — Bilkis Jahan
*Assistant Examiner* — Antonio Crite
(74) *Attorney, Agent, or Firm* — Jeffrey S LaBaw; Steven J Meyers

(57) ABSTRACT

A method for fabricating an advanced metal insulator metal capacitor structure includes providing a pattern in a dielectric layer. The pattern includes a set of features in the dielectric layer. A first metal layer is deposited in the set of features in the dielectric layer. A phase change material layer is deposited over the metal layer in the set of features in the dielectric layer. The phase change material is an insulator in a deposited state. A surface treatment process is performed on the phase change layer to produce a top surface layer having electrically conductive properties. A second metal layer is deposited on the top surface layer of the phase change layer.

13 Claims, 10 Drawing Sheets

(56) References Cited

U.S. PATENT DOCUMENTS

| | | |
|---|---|---|
| 9,253,822 B2 | 2/2016 | Lamorey |
| 9,818,689 B1 | 11/2017 | Zang |
| 2001/0005612 A1 | 6/2001 | Lee |
| 2003/0100162 A1 | 5/2003 | Kwang-Chul |
| 2005/0269703 A1* | 12/2005 | Dunn ................ H01L 21/28562 |
| | | 257/751 |
| 2007/0278620 A1* | 12/2007 | Hong .................. H01L 23/5223 |
| | | 257/532 |
| 2012/0295413 A1 | 11/2012 | Fujii |
| 2013/0143379 A1 | 6/2013 | Malholtra |
| 2017/0098606 A1 | 4/2017 | Lu |
| 2017/0271434 A1 | 9/2017 | Chou |

* cited by examiner

ADVANCED METAL INSULATOR METAL CAPACITOR

BACKGROUND OF THE INVENTION

This disclosure relates to integrated circuit devices, and more specifically, to a method and structure to create advanced metal insulator metal capacitor structures in semiconductor devices.

In many mixed signal or high frequency RF applications in integrated circuits, high performance, high speed capacitors are required. A metal insulator metal (MIM) capacitor is used commonly in high performance applications in CMOS and other semiconductor technologies. Such a capacitor has a sandwich structure and can be considered analogous to a parallel plate capacitor. The capacitor top metal (CTM) is separated from the capacitor bottom metal (CBM) by a thin insulating layer. Both of the two parallel metal plates are conventionally made from Al or AlCu alloys. These metals are patterned and etched needing several photolithography masking steps. The thin insulating dielectric layer is usually made from silicon oxide or silicon nitride deposited by chemical vapor deposition (CVD) or other deposition processes.

As the dimensions of modern integrated circuitry in semiconductor chips continues to become smaller, conventional lithography is increasingly challenged and expensive to make smaller and smaller structures. A conventional process for creating an MIM capacitor is expensive as it requires at least three additional masks (alignment mask, top electrode mask, bottom mask) to fabricate the capacitor, as well as additional including lithography and RIE processes. Further, as the dimensions of the capacitor decrease, there is a scaling challenge in maintaining the uniformity of the dielectric thickness throughout the MIM capacitor as the dielectric thickness is decreased with the rest of the device.

The present disclosure presents an advanced MIM capacitor to alleviate this problem.

BRIEF SUMMARY

According to this disclosure, an advanced MIM capacitor structure and a method for constructing the structure are described. A method for fabricating an advanced metal insulator metal capacitor structure includes providing a pattern in a dielectric layer. The pattern includes a set of features in the dielectric layer. A first metal layer is deposited in the set of features in the dielectric layer. A phase change material layer is deposited over the metal layer in the set of features in the dielectric layer. The phase change material is an insulator in a deposited state. A surface treatment process is performed on the phase change layer to produce a top surface layer having electrically conductive properties. A second metal layer is deposited on the top surface layer of the phase change layer.

The foregoing has outlined some of the more pertinent features of the disclosed subject matter. These features should be construed to be merely illustrative. Many other beneficial results can be attained by applying the disclosed subject matter in a different manner or by modifying the invention as will be described.

BRIEF DESCRIPTION OF THE DRAWINGS

For a more complete understanding of the present invention and the advantages thereof, reference is now made to the following descriptions taken in conjunction with the accompanying drawings which are not necessarily drawing to scale, and in which.

DETAILED DESCRIPTION OF THE DRAWINGS

Figure 1:
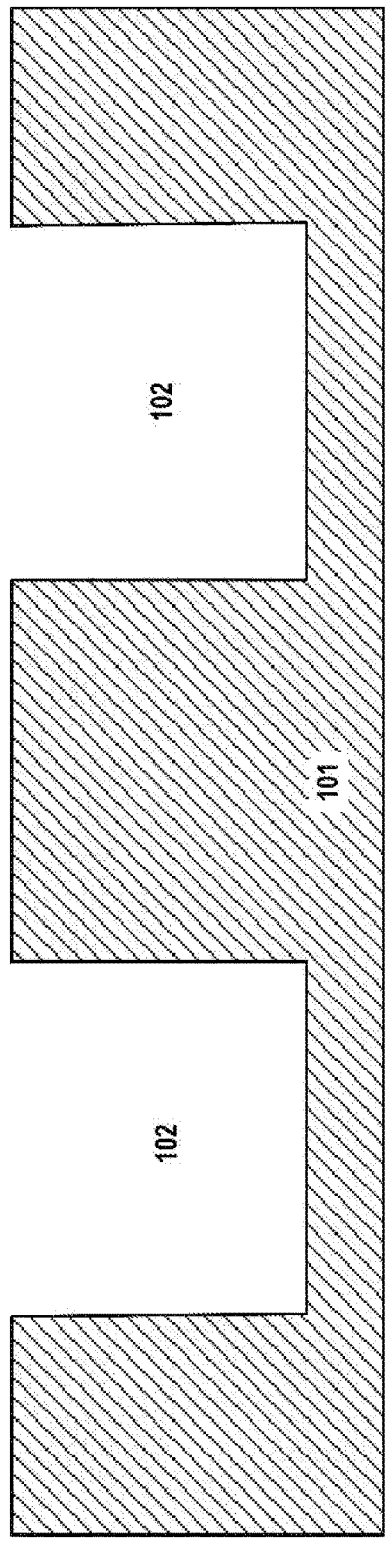
FIG. 1 is a cross-sectional diagram depicting the substrate after patterning and etching steps have been performed according to a first embodiment of the invention.

At a high level, embodiments of the invention provide a reduced insulator thickness by converting a surface portion of the insulator to a metallic material. A uniform ultra-thin insulator thickness is thus produced through a "controlled" surface treatment. This is in contrast to conventional processes in which the high-k dielectric thickness is controlled through the control of the deposition process. In embodiments of the invention, the final high-k dielectric thickness is through amount of surface treatment to reduce the original deposited high-k material.

A "substrate" as used herein can comprise any material appropriate for the given purpose (whether now known or developed in the future) and can comprise, for example, Si, SiC, SiGe, SiGeC, Ge alloys, GaAs, InAs, InP, other III-V or II-VI compound semiconductors, or organic semiconductor structures. Insulators can also be used as substrates in embodiments of the invention.

For purposes herein, a "semiconductor" is a material or structure that may include an implanted impurity that allows the material to sometimes be conductive and sometimes be a non-conductive, based on electron and hole carrier concentration. As used herein, "implantation processes" can take any appropriate form (whether now known or developed in the future) and can comprise, for example, ion implantation.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to hafnium oxide, aluminum oxide, silicon nitride, silicon oxynitride, a gate dielectric stack of SiO2 and Si3N4, and metal oxides like tantalum oxide that have relative dielectric constants above that of SiO2 (above 3.9). The dielectric can be a combination of two or more of these materials. The thickness of dielectrics herein may vary contingent upon the required device performance. The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

Electrically conductive" and/or "electrical conductor" as used through the present disclosure means a material typically having a room temperature resistivity less than about 400 μΩ-cm. As used herein, the terms "insulator" and "dielectric" denote a material having a room temperature resistivity greater than about 400 μΩ-cm.

When patterning any material herein, the material to be patterned can be grown or deposited in any known manner and a patterning layer (such as an organic photoresist aka "resist") can be formed over the material. The patterning layer (resist) can be exposed to some form of light radiation (e.g., patterned exposure, laser exposure) provided in a light exposure pattern, and then the resist is developed using a chemical agent. This process changes the characteristic of the portion of the resist that was exposed to the light. Then one portion of the resist can be rinsed off, leaving the other portion of the resist to protect the material to be patterned. A material removal process is then performed (e.g., plasma etching) to remove the unprotected portions of the material to be patterned. The resist is subsequently removed to leave the underlying material patterned according to the light exposure pattern.

For purposes herein, "sidewall structures" are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as a sidewall structure. The sidewall structures can be used as masking structures for further semiconducting processing steps.

Embodiments will be explained below with reference to the accompanying drawings.

Figure 9:
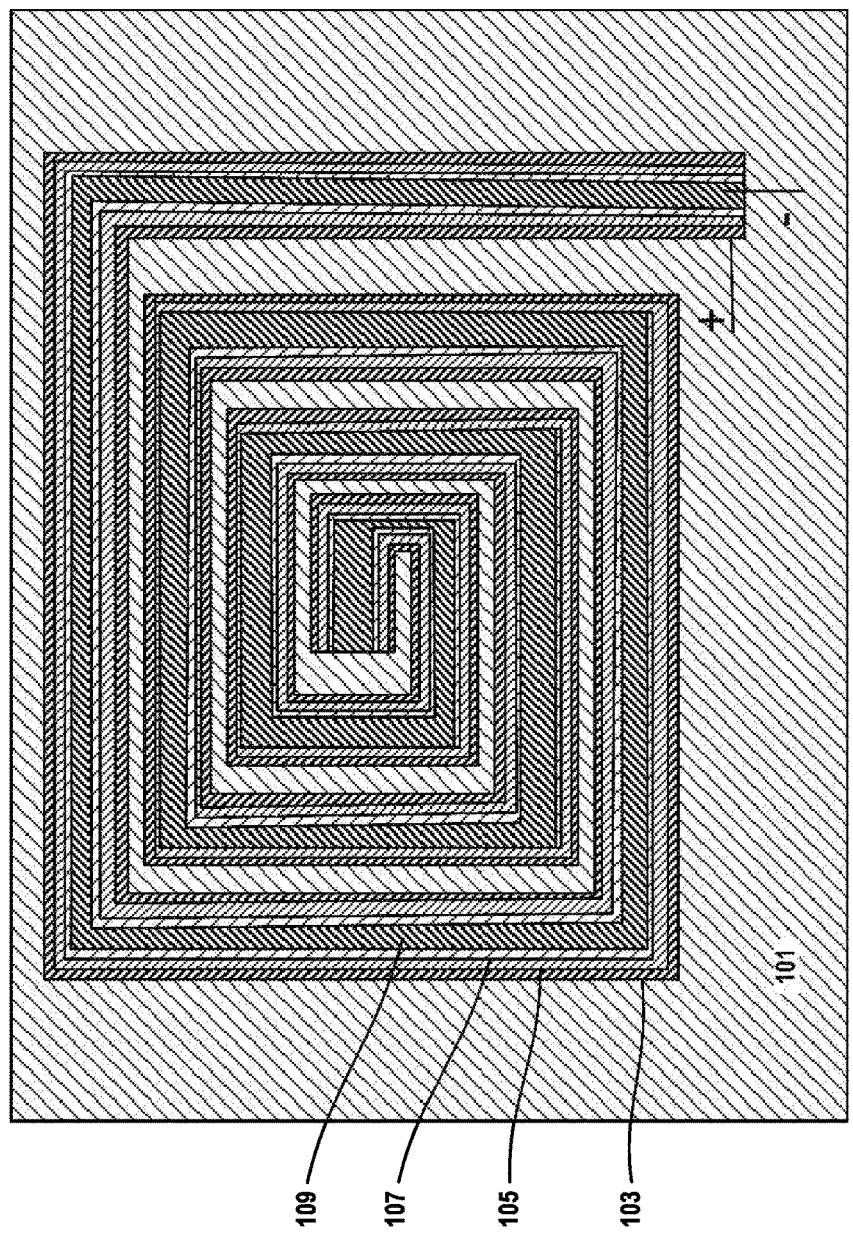
FIG. 9 is a top view diagram depicting the structure after the metal fill deposition has been performed according to the first embodiment of the invention.

FIG. 1 is a cross-sectional diagram depicting the structure formed in a dielectric material 101 after patterning and etching steps have been performed according to a first embodiment of the invention. Although only a pair of features 102 is shown for ease in illustration, the patterned dielectric structure could be more complicated and include a set of vias, a set of trenches, a set of indentations or combination of the same in different embodiments of the invention. A top view of one preferred embodiment of the invention is shown in FIG. 9.

The dielectric material 101 may be made of dielectrics including inorganic dielectrics or organic dielectrics. In some embodiments, the dielectric material 101 may be composed of a single dielectric material. In other embodiments, the dielectric material 101 may be composed of at least two different dielectric materials. In one embodiment, the dielectric material 101 may be non-porous. In another embodiment, the dielectric material 101 may be porous. Some examples of suitable dielectrics that can be used as the dielectric material 101 include, but are not limited to, SiO2, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

As is known, to form such a pattern in a dielectric, a photoresist or sacrificial mandrel layer can be patterned over a dielectric layer. The subsequent etch will create the dielectric structure depicted in FIG. 1. The dielectric layer 101 is silicon dioxide in preferred embodiments, however, other dielectric materials are used in other embodiments of the invention. Further, the dielectric layer 101 is preferably part of a multilayer structure comprising a plurality of materials.

Figure 2:
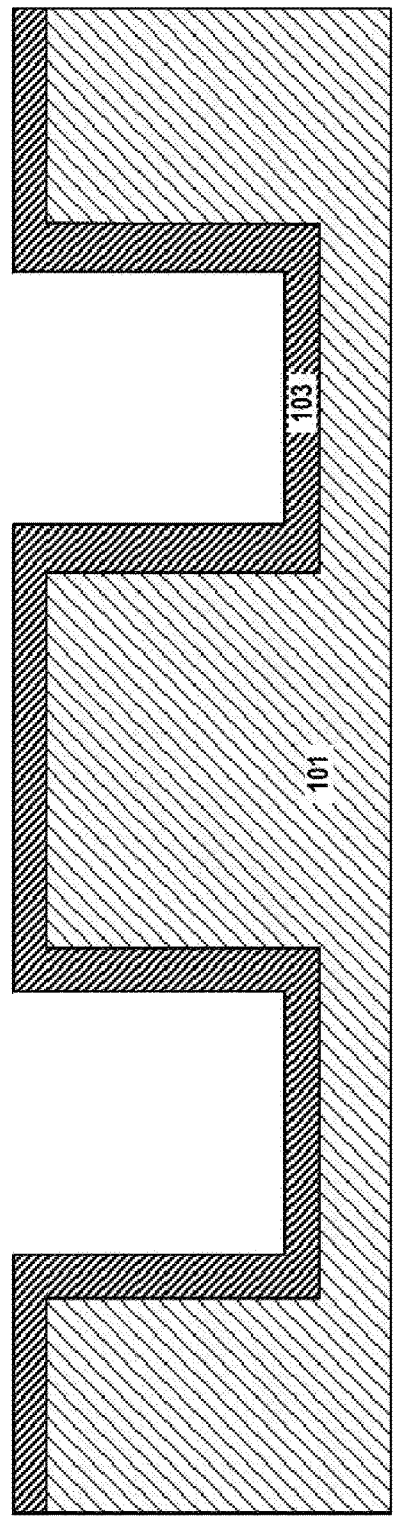
FIG. 2 is a cross-sectional diagram depicting the substrate structure after a first metal layer deposition step has been performed according to a first embodiment of the invention.

FIG. 2 is a cross-sectional diagram depicting the substrate structure after a first metal deposition step has been performed according to a first embodiment of the invention. In preferred embodiments of the invention, the first metal material is selected from the group of Cu, Al, Ta, Ti, W, Co, their nitride alloys or a combination of the same is deposited. The first metal material is deposited as a capacitor bottom metal (CBM) 103 over the patterned dielectric layer 101 utilizing any conventional deposition process including, for example, chemical vapor deposition (CVD), plasma enhanced chemical vapor deposition (PECVD), physical vapor deposition (PVD) or sputtering. In embodiments where the features are a set of trenches in the dielectric layer, the first metal layer covers the bottom and sidewalls of the set of trenches. The thickness of the layer 103 can vary according to the type of layer being formed and the technique used in forming the same. Typically, the layer 103 has a thickness from 0.5 nm to 200 nm with a thickness from 1 nm to 100 nm being more typical.

Figure 3:
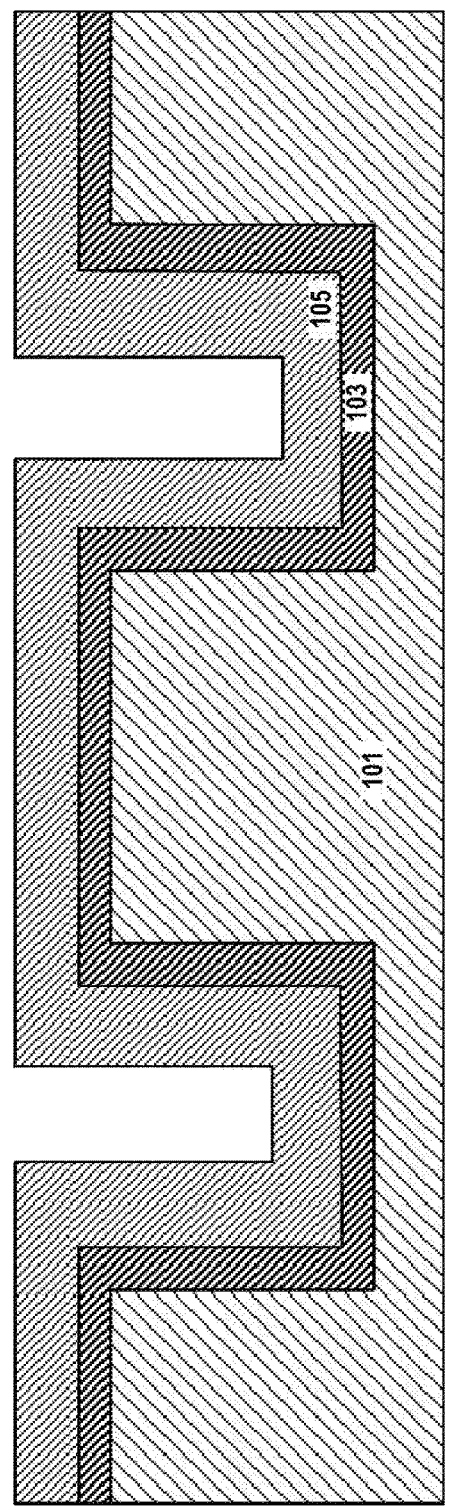
FIG. 3 is a cross-sectional diagram depicting the structure after an insulator deposition step has been performed according to a first embodiment of the invention.

FIG. 3 is a cross-sectional diagram depicting the structure after an insulator deposition step has been performed according to a first embodiment of the invention. In one embodiment, the insulator 105 is a high-k dielectric 105 which is a phase change material. In preferred embodiments of the invention, the phase change material is an alloy which is a doped metallic insulator selected from a nitrogen doped metallic insulator, an oxygen doped metallic insulator or a nitrogen and oxygen doped metallic insulator. That is, in one embodiment, the high-k dielectric may include a nitrogen-doped metallic insulator that is composed of nitrogen, N, and a metal, M. In another embodiment, high-k dielectric 105 may include an oxygen-doped metallic insulator that is composed of oxygen, O, and a metal, M. In yet another embodiment, high-k dielectric 105 may include a nitrogen- and oxygen-doped metallic insulator that is composed of nitrogen, N, oxygen, O, and a metal M. In any of the above mentioned embodiments, metal, M, is an ohmic material such as, for example, titanium (Ti), tantalum (Ta), ruthenium (Ru), tungsten (W), platinum (Pt), cobalt (Co), rhodium (Rh) and manganese (Mn).

In the preferred embodiment, the insulator is a Ta3N5 layer 105 can be formed by a conventional deposition process including, for example, chemical vapor deposition (CVD), plasma enhanced chemical vapor deposition (PECVD), atomic layer deposition (ALD), physical vapor deposition (PVD), sputtering, chemical solution deposition and plating. In preferred embodiments, the thickness of the Ta3N5 layer will be sufficient to cover the first metal layer 103 and in the range of 2 nm to 300 nm, with a thickness from 4 nm to 200 nm being more typical. As illustrated, the Ta3N5 deposition layer 105 is substantially conformal over the metal layer 103.

Figure 4:
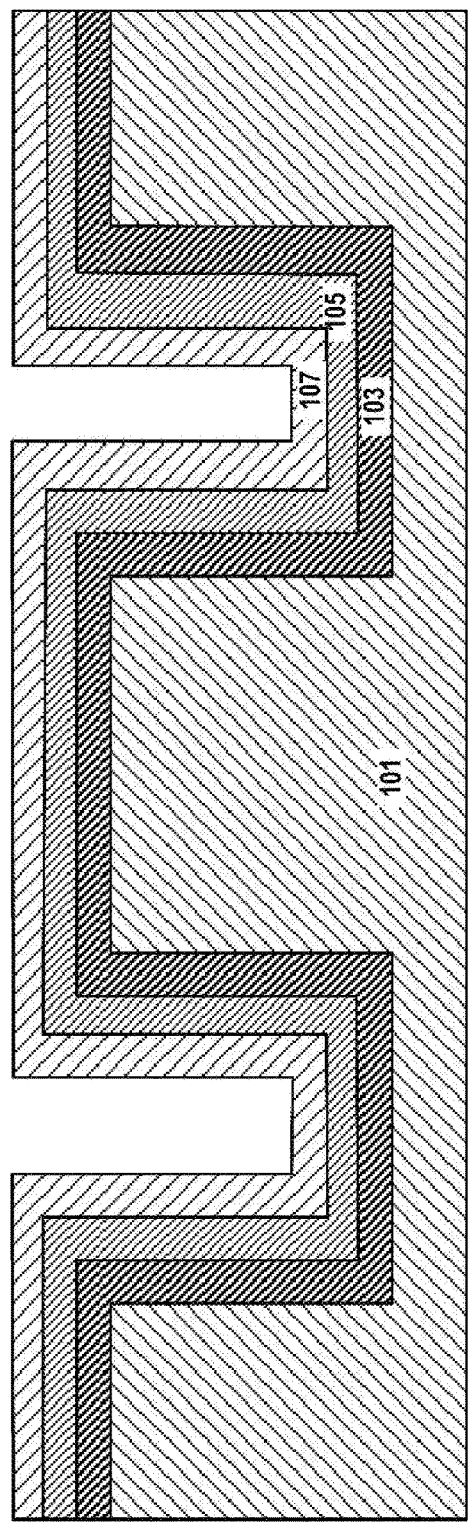
FIG. 4 is a cross-sectional diagram depicting the structure after a controlled surface treatment step has been performed on the insulator layer according to a first embodiment of the invention.

FIG. 4 is a cross-sectional diagram depicting the structure after a controlled surface treatment step has been performed on the insulator layer according to a first embodiment of the invention. In the preferred embodiments in which the insulator is Ta3N5, the surface treatment converts the deposited high-k to metallic TaN. The TaN layer 107 is created utilizing a plasma, neutral atom beam or gas cluster (GCIB) process which converts the Ta3N5 to TaN in the surface portion of the original layer. In alternative embodiments of the invention, the surface treatment process converts the doped metallic insulator to a respective one of a metallic nitride, a metallic oxide, and a metallic nitride-oxide. The surface treatment is advantageous as there are no foreign materials or impurities between the first layer of the insulating phase change material and the second layer of the electrical conductive phase change material.

When a plasma nitridation process is employed, an electrical bias of greater than 200 W can be employed. The plasma process is performed by generating a plasma from an ambient containing at least one of, but not limited to, He, Ne, Ar, N2, H2 and mixtures thereof. In one embodiment, the plasma nitridation process employed in the present application is performed at a temperature from 50° C. to 450° C. In another embodiment, the plasma nitridation process employed in the present application is performed at a temperature from 100° C. to 300° C.

The controlled surface treatment of the high-k Ta3N5 heats the material causing a phase change in the tantalum nitrogen alloy to a higher conductivity phase like TaN. The Ta3N5 phase of the tantalum nitrogen alloy may be referred to as an orthorhombic phase (or Amorphous), which may be considered as a dielectric material. The TaN phase of the tantalum nitrogen alloy may be referred to as a cubic or hexagonal phase, and may be considered an electrical conductor.

Thermally heating the phase change material layer (through a controlled surface treatment) can change crystal structure. The change in crystal structure changes the nitrogen (N) to tantalum (Ta) ratio in the phase change material layer to convert the material layer from its insulating phase to an electrically conductive phase. For example, thermally heating the phase change material layer (through a controlled surface treatment) to cause a phase change from an insulating Orthorhombic crystal structure (or Amorphous), e.g., Ta3N5 composition to an electrically conductive Cubic or hexagonal crystal structure, e.g., TaN composition.

Figure 5:
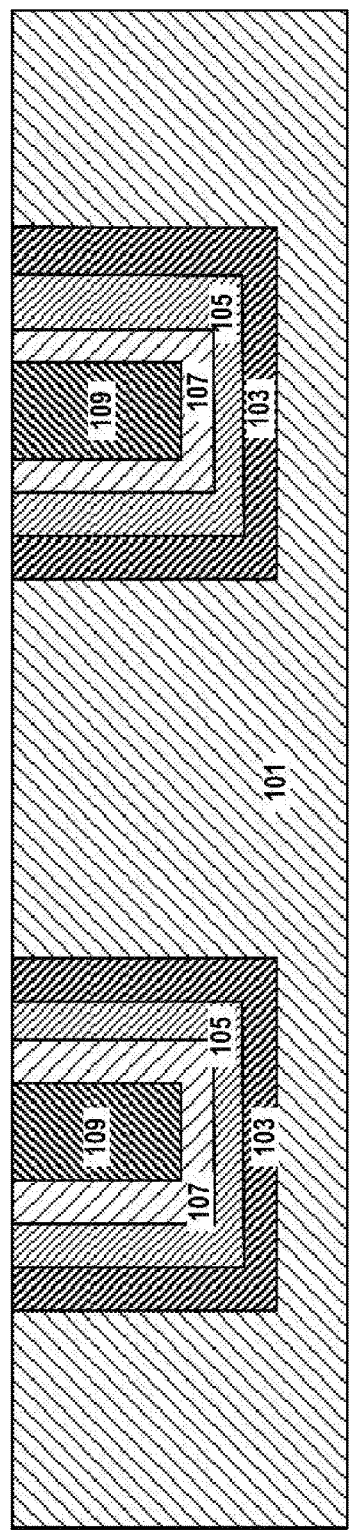
FIG. 5 is a cross-sectional diagram depicting the structure after a metal fill deposition and planarization step have been performed according to a first embodiment of the invention.

FIG. 5 is a cross-sectional diagram depicting the structure after a metal fill deposition and a planarization step have been performed according to a first embodiment of the invention. The second metal layer 109 can be selected from Cu, Al, W, Co, Rh, Ni, Rh, Ta, Ti, their nitrides and combinations thereof. The second metal layer 109 and the converted metallic layer 107 form the capacitor top metal (CTM) of the MIM capacitor.

Deposition of the second metal layer can be accomplished utilizing any conventional deposition process including, for example, chemical vapor deposition (CVD), plasma enhanced chemical vapor deposition (PECVD), physical vapor deposition (PVD), sputtering, plating, chemical solution deposition and electroless plating. In preferred embodiments, the thickness of the second metal layer 109 is at least sufficient to fill the remainder of trench. In preferred embodiments, the thickness of the second metal layer 109 will be in the range of 2 nm to 400 nm, with a thickness from 10 nm to 200 nm being more typical. The thickness of the second metal layer 109 is selected to complete the feature fill of the voids which are shown in FIG. 4.

The drawing depicts the structure after a planarization process such as a chemical mechanical polishing (CMP) step has been performed according to a first embodiment of the invention. Typically, a CMP process uses an abrasive and corrosive chemical slurry (commonly a colloid) in conjunction with a polishing pad. The pad and wafer are pressed together by a dynamic polishing head and held in place by a plastic retaining ring. As shown, the CMP step has removed the excess portions of the first metal layer 103, the insulator layer 105, the converted metallic layer 107 and the second metal layer 109 in the field areas of the dielectric layer 101 outside the features of the pattern in the dielectric 101. Also, at least some of the layers, i.e the first metal layer 103, the insulator layer 105, the converted metallic layer 107, conform to the topology of the feature in which the MIM capacitor, following the contours of the sidewalls and bottom. Other planarization processes are known to the art and are used in alternative embodiments of the invention.

Figure 6:
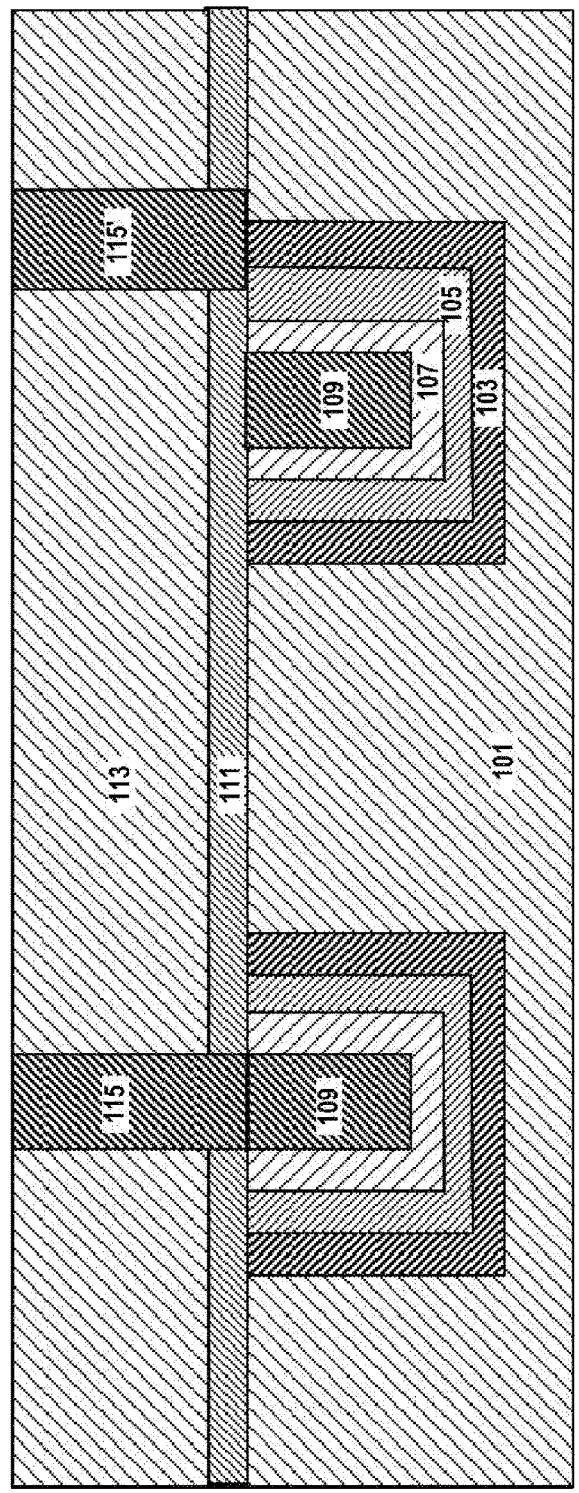
FIG. 6 is a cross-sectional diagram depicting the structure after the contact metallurgy has been formed according to a first embodiment of the invention.

FIG. 6 is a cross-sectional diagram depicting the structure after connectors have been formed according to a first embodiment of the invention. In this embodiment, a dielectric capping layer 111 is deposited over the structure depicted in FIG. 5. The dielectric capping layer is Si3N4 in one preferred embodiment. However, other dielectrics such as SiC, SiO2, SiC(N,H) or combination of the same may be used in alternative embodiments. The dielectric capping layer 111 can be deposited in a conventional deposition process such as a low pressure chemical vapor deposition (LPCVD) process or any other suitable deposition technique.

Next, a layer 113 of dielectric is deposited over the dielectric capping layer 111. In a preferred embodiment, the dielectric layer 113 is comprised of the same dielectric as the first dielectric layer 101, e.g., silicon dioxide. Deposition of the 113 can be through one of chemical vapor deposition (CVD) or spin on deposition processes. Then, a mask is patterned over the dielectric layer 113 and a contact hole is etched through the third dielectric layer 113 and second dielectric layer 111. The mask is removed, and the contact hole is filled with a connector metal layer 115. The metal selected for the connectors 115 may be the same as used for the second metal layer 109, i.e. selected from Cu, Al, W, Co, Rh, Ni, Rh, Ta, Ti, their nitrides and a combination thereof. Deposition of the connector metal layer 115 can be accomplished utilizing any conventional deposition process as discussed above. A planarization step is performed to remove excess connector metal from the field areas and prepare the connectors 115, 115' for additional metal layers. One connector 115 connects upper level metallurgy to the capacitor top metal (CTM) of the MIM capacitor while the other connector 115' connects upper level metallurgy to the capacitor bottom metal (CBM) of the MIM capacitor.

Figure 7:
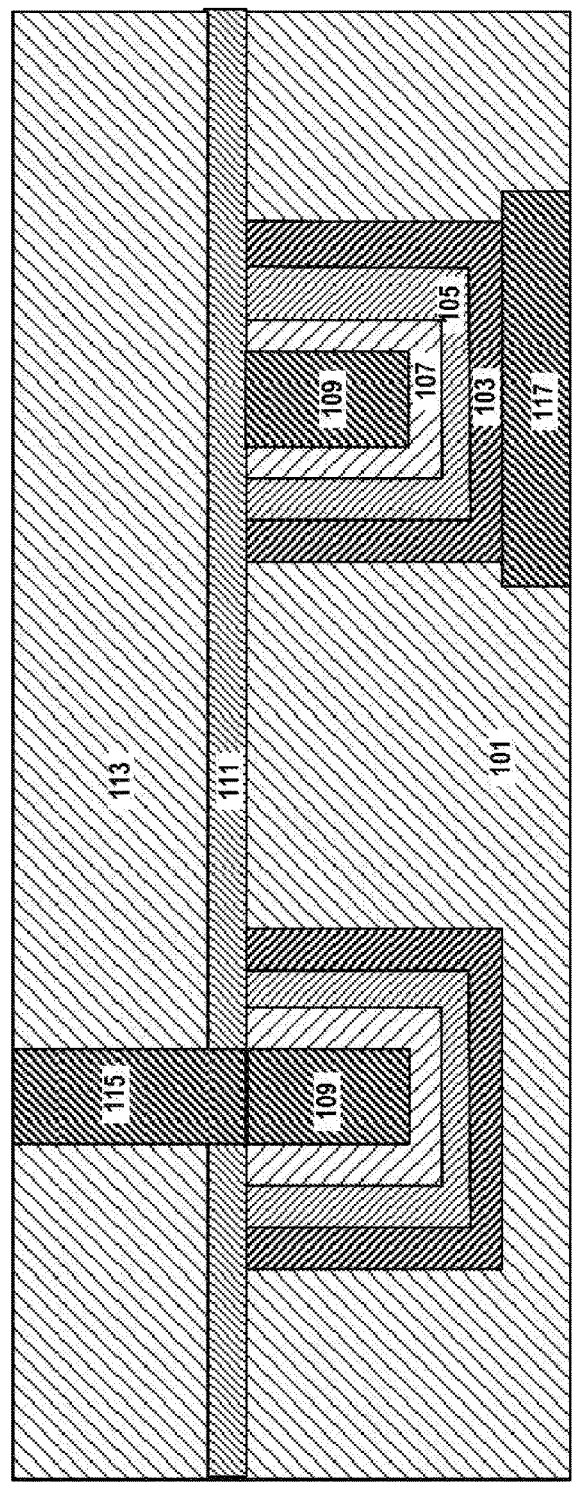
FIG. 7 is a cross-sectional diagram depicting the structure after the contact metallurgy has been formed according to a second embodiment of the invention.

FIG. 7 is a cross-sectional diagram depicting the structure after connectors have been formed according to a second embodiment of the invention. This structure is similar to that displayed in FIG. 6 for the first embodiment, except that a bottom connector 117 connects to the capacitor bottom metal (CBM) of the MIM capacitor. The choice between the first embodiment and the second embodiment is dependent upon the designer's choice in circuit design.

Figure 8:
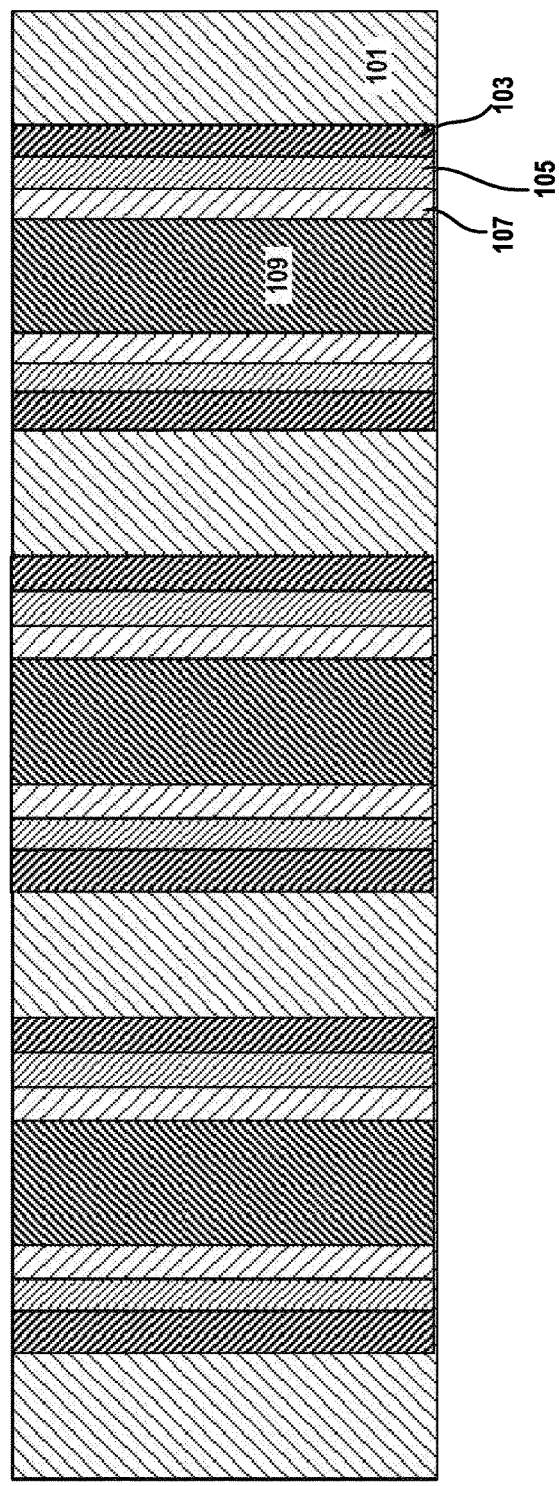
FIG. 8 is a top view diagram depicting the structure after the metal fill deposition has been performed according to the first embodiment of the invention.

FIG. 8 is a top view diagram depicting the structure after the metal fill deposition has been performed according to the first embodiment of the invention. This figure corresponds to FIG. 5 which depicts the structure after a chemical mechanical polishing (CMP) step or other planarization has been performed. In FIG. 8, the MIM capacitor is formed in trenches and comprised of the first metal layer 103, the insulator layer 105, the converted metallic layer 107 and the second metal layer 109. In this top view, the field areas of the dielectric layer 101 outside the features of the MIM capacitor are visible. Each of the trenches can form its own MIM capacitor, or as shown in FIG. 9 can be part of a larger capacitor structure.

FIG. 9 is a top view diagram depicting the structure after the metal fill deposition and planarization steps have been performed according to the first embodiment of the invention. In this embodiment, the trenches are joined together to form a serpentine pattern. Such a serpentine pattern combined with the depth of the trenches increases the size of the capacitor top metal (CTM) and the capacitor bottom metal (CBM), thus increasing the charge carrying capability or capacitance of the capacitor for a given chip area. By increasing a given trench depth, a chip designer can further increase the capacitance for a given chip area.

Figure 10:
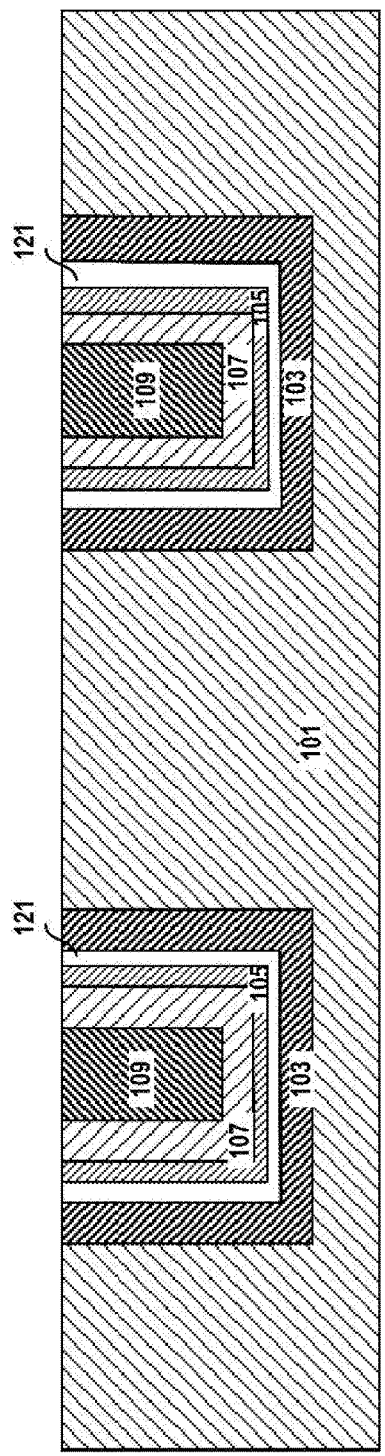
FIG. 10 is a cross-sectional diagram depicting the structure after a metal fill deposition step has been performed according to a third embodiment of the invention.

FIG. 10 is a cross-sectional diagram depicting the structure after a metal fill deposition step has been performed according to a third embodiment of the invention. This drawing is analogous to FIG. 5 in the first embodiment. FIG. 10 shows the result when a Si3N4 layer, or another high-k material is used to create a hybrid dielectric. In this embodiment, a Si3N4 layer 121 (or other high-k material) deposition is performed after the deposition of the first metal 103 in FIG. 2 and before Ta3N5 deposition 105 in FIG. 3. Suitable deposition processes include chemical vapor deposition (CVD), atomic layer deposition (ALD), physical vapor deposition (PVD), and spin-on deposition processes. In preferred embodiments, the thickness of the high-k layer 121 will be sufficient to cover the first metal layer 103 and in the range of 0.5 nm to 20 nm. In alternative embodiments, other high-k materials such as hafnium silicate (HfO2), zirconium silicate (ZrSiO4), hafnium dioxide (HfO2), zirconium dioxide (ZrO2), aluminum oxide (Al2O3), and yttrium oxide (Y2O3) are used. In this case, the resulting structure contains a "bilayer" high-k dielectric to adjust the dielectric performance of the capacitor. The remaining process flow is consistent with the first embodiment using Ta3N5 of the current application. Either of the contact embodiments of FIG. 8 or FIG. 9 could be used with this "bilayer" high-k dielectric embodiment.

Processing of additional layers of the integrated circuit device proceeds after the steps illustrated in the disclosure. For example, additional conductive lines could be created using an embodiment of the invention in subsequent steps if required for completion of the integrated circuit.

The resulting structure can be included within integrated circuit chips, which can be distributed by the fabricator in wafer form (that is, as a single wafer that has multiple chips), as a bare die, or in a packaged form. In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Embodiments of the invention provides a reduced insulator thickness by converting a surface portion of the insulator to a metallic material. A uniform ultra-thin insulator thickness is thus produced through a "controlled" surface treatment. This is in contrast to conventional processes in which the high-k dielectric thickness is controlled through the control of the deposition process. In embodiments of the invention, the final high-k thickness is through amount of surface treatment to reduce the original deposited high-k material.

While only one or a limited number of features are illustrated in the drawings, those ordinarily skilled in the art would understand that many different types of features could be simultaneously formed with the embodiment herein and the drawings are intended to show simultaneous formation of multiple different types of features. However, the drawings have been simplified to only show a limited number of features for clarity and to allow the reader to more easily recognize the different features illustrated. This is not intended to limit the invention because, as would be understood by those ordinarily skilled in the art, the invention is applicable to structures that include many of each type of feature shown in the drawings.

While the above describes a particular order of operations performed by certain embodiments of the invention, it should be understood that such order is exemplary, as alternative embodiments may perform the operations in a different order, combine certain operations, overlap certain operations, or the like. References in the specification to a given embodiment indicate that the embodiment described may include a particular feature, structure, or characteristic, but every embodiment may not necessarily include the particular feature, structure, or characteristic.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having described our invention, what we now claim is as follows:

1. A method for fabricating an advanced metal insulator metal capacitor structure comprising:
   providing a pattern in a dielectric layer, wherein the pattern includes a set of features in the dielectric layer;
   depositing a first metal layer in the set of features in the dielectric layer;
   depositing a phase change material layer of a phase change material over the metal layer in the set of features in the dielectric layer, wherein the phase change material is an insulator in a deposited state;
   performing a surface treatment process on the phase change material layer in the deposited state to produce a top surface layer of the phase change material having electrically conductive properties; and
   depositing a second metal layer on the top surface layer.

2. The method as recited in claim 1, wherein the phase change material is deposited as Ta3N5.

3. The method as recited in claim 1, wherein the phase change material has insulating properties and an orthorhombic phase in the deposited state prior to the surface treatment.

4. The method as recited in claim 1, further comprising removing excess portions of the first metal layer, the phase change material and the second metal layer outside the set of features in the dielectric layer using a planarization process.

5. The method as recited in claim 1, wherein the surface treatment is selected from the group of a plasma process, a neutral atom beam process and a gas cluster (GCIB) process.

6. The method as recited in claim 1, further comprising:
   depositing a high-k dielectric layer over the first metal layer, before the deposition of the phase change material.

7. The method as recited in claim 1, wherein the second metal layer is deposited in the set of features filling a remainder portion of the set of features not filled by the phase change material layer and the first metal layer.

8. The method as recited in claim 1, wherein a thickness of insulator comprised of the phase change material layer is reduced by converting a thickness of the top surface of the phase change material layer to have conductive properties.

9. The method as recited in claim 1, wherein the top surface layer of the phase change material has electrically conductive properties and an Cubic or hexagonal phase following the surface treatment.

10. The method as recited in claim 9, wherein the top surface of the phase change material is TaN.

11. The method as recited in claim 1, wherein the set of features are a set of trenches in the dielectric layer.

12. The method as recited in claim 11, wherein the set of trenches form a serpentine pattern in the dielectric and wherein the second metal layer is deposited in the set of features filling a remainder portion of the set of features not filled by the phase change material layer and the first metal layer.

13. The method as recited in claim 11, wherein the first metal layer covers a bottom and a pair of sidewalls of the set of trenches, forming a u-shaped cross-section.

* * * * *